(12) United States Patent
Tsang (10) Patent No.: US 6,963,500 B2
(45) Date of Patent: Nov. 8, 2005

(54) MAGNETIC TUNNELING JUNCTION CELL ARRAY WITH SHARED REFERENCE LAYER FOR MRAM APPLICATIONS

(75) Inventor: David Tsang, Cupertino, CA (US)

(73) Assignee: Applied Spintronics Technology, Inc., Cupertino, CA (US)

(*) Notice: Subject to any disclaimer, the term of this patent is extended or adjusted under 35 U.S.C. 154(b) by 0 days.

(21) Appl. No.: 10/781,131

(22) Filed: Feb. 17, 2004

(65) Prior Publication Data

US 2004/0179395 A1    Sep. 16, 2004

Related U.S. Application Data

(60) Provisional application No. 60/454,320, filed on Mar. 14, 2003.

(51) Int. Cl.[7] .............................................. G11C 11/14
(52) U.S. Cl. ....................... 365/171; 365/158; 365/145; 365/173
(58) Field of Search ............................... 365/158, 171, 365/173, 225.5; 257/421, 422

(56) References Cited

U.S. PATENT DOCUMENTS

| | | | |
|---|---|---|---|
| 5,659,499 A | 8/1997 | Chen et al. | |
| 5,940,319 A | 8/1999 | Durlam et al. | |
| 6,153,443 A | 11/2000 | Durlam et al. | |
| 6,211,090 B1 | 4/2001 | Durlam et al. | |
| 6,269,018 B1 * | 7/2001 | Monsma et al. | 365/145 |
| 6,351,409 B1 * | 2/2002 | Rizzo et al. | 365/158 |
| 6,538,920 B2 * | 3/2003 | Sharma et al. | 365/171 |
| 6,649,960 B1 * | 11/2003 | Cross | 257/296 |
| 6,740,947 B1 * | 5/2004 | Bhattacharyya et al. | 257/421 |
| 2002/0080643 A1 | 6/2002 | Ito | |
| 2002/0127743 A1 | 9/2002 | Nickel et al. | |

* cited by examiner

Primary Examiner—Anh Phung
Assistant Examiner—Toan Le
(74) Attorney, Agent, or Firm—Sawyer Law Group LLP (57) ABSTRACT

A method and system for providing a magnetic memory is disclosed. The method and system include providing a plurality of magnetic elements and a plurality of reference layers. Each of the magnetic elements includes a free layer and a spacer layer. Each of the reference layers is coupled with a corresponding portion of the magnetic elements. The reference layers are ferromagnetic. A portion of each reference layer functions as at least a portion of a pinned layer for each of the corresponding portion of the magnetic elements. The portion of each of the plurality of reference layers also functions as a write line for the corresponding portion of the plurality of magnetic elements. The spacer layer resides between the free layer of each of the plurality of magnetic elements and the reference layer.

17 Claims, 8 Drawing Sheets

MAGNETIC TUNNELING JUNCTION CELL ARRAY WITH SHARED REFERENCE LAYER FOR MRAM APPLICATIONS

CROSS-REFERENCE TO RELATED APPLICATIONS

This application is claiming under 35 USC 119(e) the benefit of provisional patent application Ser. No. 60/454,320 filed Mar. 14, 2003.

The present application is related to co-pending U.S. patent application Ser. No. 10/459,133 entitled "MRAM MEMORIES UTILIZING MAGNETIC WRITE LINES", filed on Jun. 11, 2003, and assigned to the assignee of the present application.

FIELD OF THE INVENTION

The present invention pertains to magnetic memories, and more particularly to a method and system for providing write lines for nonvolatile magnetic random access memory (MRAM) that may have a simplified manufacturing process, reduced cell size, improved reliability, improved stability against stray magnetic field, and improved write efficiency.

BACKGROUND OF THE INVENTION

Figure 1A:
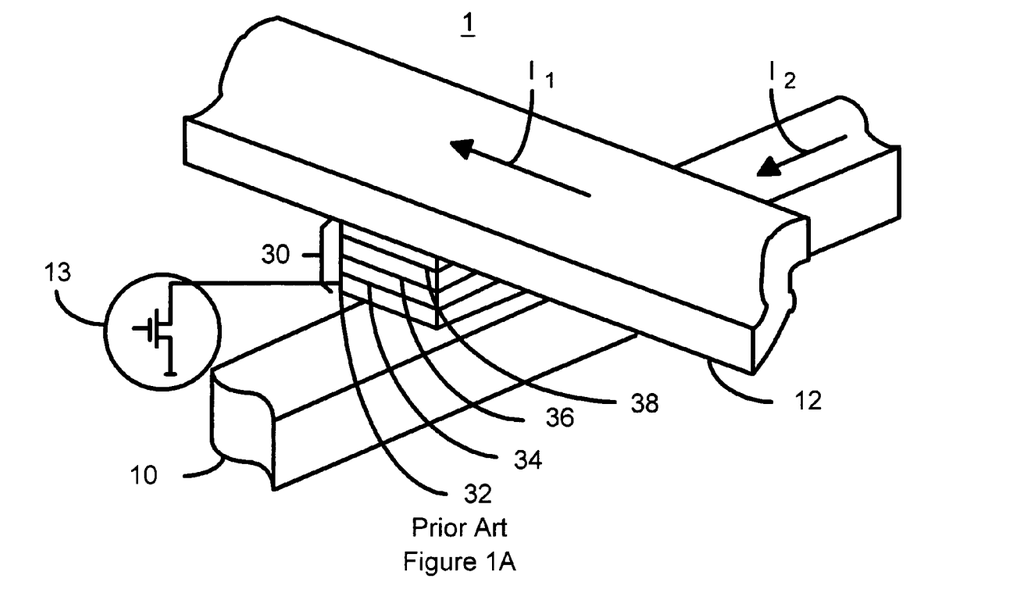
FIG. 1A is a three-dimensional view of a portion of a conventional magnetic memory including a MTJ cell, located at the intersection of a bit line and a word line.

Recently, a renewed interest in thin-film magnetic random access memories (MRAM) has been sparked by the potential application of MRAM to both nonvolatile and volatile memories. FIG. 1A depicts a portion of a conventional MRAM 1. The conventional MRAM includes conventional orthogonal conductor lines 10 and 12, conventional magnetic storage cell having a MTJ 30 and conventional transistor 13. The conventional MRAM 1 utilizes a conventional magnetic tunneling junction (MTJ) stack 30 as a memory cell. Use of a conventional MTJ stack 30 makes it possible to design an MRAM cell with high integration density, high speed, low read power, and soft error rate (SER) immunity. The conductive lines 10 and 12 are used for writing data into the MTJ stack 30. The MTJ stack 30 is located on the intersection of and between conventional conductive lines 10 and 12. Conventional conductive line 10 and line 12 are referred to as the conventional word line 10 and the conventional bit line 12, respectively. The names, however, are interchangeable. Other names, such as row line, column line, digit line, and data line, may also be used.

The conventional MTJ 30 stack primarily includes the free layer 38 with a changeable magnetic vector (not explicitly shown), the pinned layer 34 with a fixed magnetic vector (not explicitly shown), and an insulator 36 in between the two magnetic layers 34 and 38. The insulator 36 typically has a thickness that is low enough to allow tunneling of charge carriers between the magnetic layers 34 and 38. Layer 32 is usually a composite of seed layers and an antiferromagnetic (AFM) layer that is strongly coupled to the pinned magnetic layer. The AFM layer included in the layers 32 is usually Mn alloy, such as IrMn, NiMn, PdMn, PtMn, CrPtMn, and so on. The AFM layer is typically strongly exchanged coupled to the pinned layer 34 to ensure that the magnetic vector of the pinned layer 34 is strongly pinned in a particular direction.

When the magnetic vector of the free layer 38 is aligned with that of the pinned layer 34, the MTJ stack 30 is in a low resistance state. When the magnetic vector of the free layer 38 is antiparallel to that of the pinned layer 34, the MTJ stack 30 is in a high resistance state. Thus, the resistance of the MTJ stack 30 measured across the insulating layer 34 is lower when the magnetic vectors of the layers 34 and 38 are parallel than when the magnetic vectors of the layers 34 and 38 are in opposite directions.

Data is stored in the conventional MTJ stack 30 by applying a magnetic field to the conventional MTJ stack 30. The applied magnetic field has a direction chosen to move the changeable magnetic vector of the free layer 30 to a selected orientation. During writing, the electrical current $I_1$ flowing in the conventional bit line 12 and $I_2$ flowing in the conventional word line 10 yield two magnetic fields on the free layer 38. In response to the magnetic fields generated by the currents $I_1$ and $I_2$, the magnetic vector in free layer 38 is oriented in a particular, stable direction. This direction depends on the direction and amplitude of $I_1$ and $I_2$ and the properties and shape of the free layer 38. Generally, writing a zero (0) requires the direction of either $I_1$ or $I_2$ to be different than when writing a one (1). Typically, the aligned orientation can be designated a logic 1 or 0, while the misaligned orientation is the opposite, i.e., a logic 0 or 1, respectively.

Stored data is read or sensed by passing a current through the conventional MTJ cell from one magnetic layer to the other. During reading, the conventional transistor 13 is turned on and a small tunneling current flows through the conventional MTJ stack 30. The amount of the current flowing through the conventional MTJ stack 30 or the voltage drop across the conventional MTJ stack 30 is measured to determine the state of the memory cell. In some designs, the conventional transistor 13 is replaced by a diode, or completely omitted, with the conventional MTJ stack 30 in direct contact with the conventional word line 10.

Figure 1B:
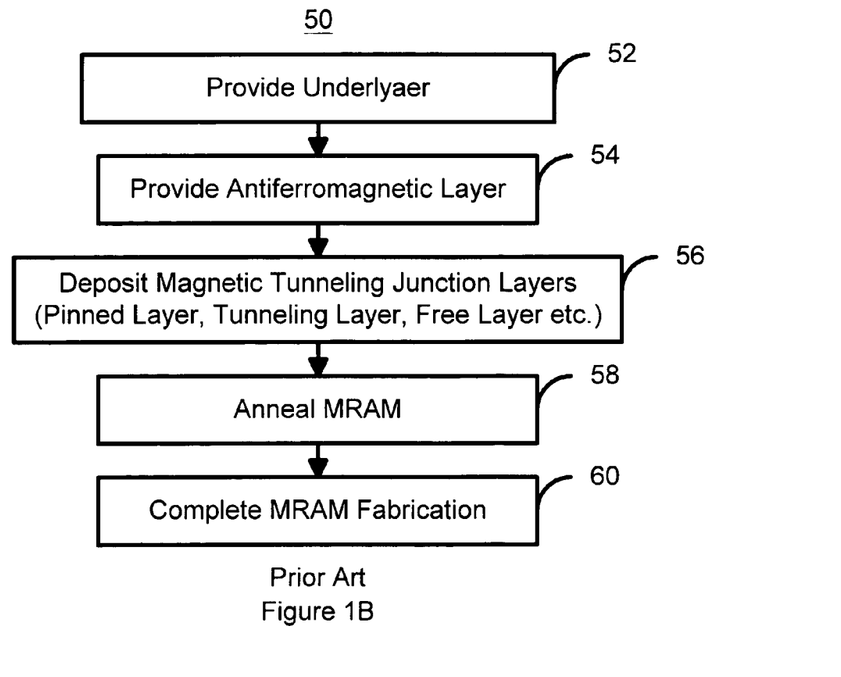
FIG. 1B is a high-level flow chart of a conventional method for providing an MTJ stack in a conventional magnetic memory.

FIG. 1B is a high-level flow chart of a conventional method 50 for providing an MTJ stack in a conventional magnetic memory. For clarity, the method 50 is described in the context of the conventional MRAM 1 depicted in FIG. 1A. Referring to FIGS. 1A and 1B, an underlayer, which is part of the layers 32, is deposited, via step 52. The AFM layer that is also included in the layers 32 is deposited, via step 54. As discussed above, the AFM layer is typically Mn alloy, such as IrMn, NiMn, PdMn, PtMn, CrPtMn, and so on. The underlayer is used to achieve a particular type of grain structure and orientation for the AFM layer. Such a grain structure and orientation for the AFM layer allows for a good exchange coupling between the AFM layer and the pinned layer 34 to be achieved.

The remainder of the MTJ stack 30 is deposited, via step 56. In order to activate, align, and strengthen the exchange coupling field, an annealing step is performed, via step 58. When Mn alloys are used in the AFM layer, the annealing step is typically performed at temperatures between two hundred and three hundred degrees Celsius in a magnetic field. The actual annealing temperature is optimized for each type of Mn alloys. If the temperature used in step 58 is too low, the annealing step may not be able to activate the exchange effect or set the direction of the exchange coupling. If the temperature used in step 58 is too high, the annealing step may cause interlayer diffusion of different type of materials and degrade or even damage the exchange coupling.

The MRAM fabrication is completed, via step 60. Step 60 typically includes photolithography and etching processes to define the MTJ stack 30. However, these processes might be performed as part of step 54. In addition, the wafers on which the MRAM 1 is fabricated may still go through some process steps at relatively high temperature.

Although the conventional method 50 and the conventional MRAM 1 function, one of ordinary skill in the art will readily recognize that processing steps performed after fabrication of the MTJ stack 30 may damage the MTJ stack 30. For example, a forming gas annealing step that is used to repair plasma-related damage at the $SiO_2$ and Si interface, is typically performed after step 60. Such a forming gas annealing step is typically performed at four hundred degrees Celsius for thirty minutes. Severe damage may be observed in the MTJ stack 30 after annealing of this type.

Accordingly, what is needed is a method and system for providing a magnetic memory in which performance of the memory element is not compromised due to processing. It would be desirable to achieve reduced interlayer diffusion and/or other damage due to processing without compromising performance of the magnetic element. For example, it would be desirable to obtain a simplified manufacturing process, reduced cell size, improved reliability, improved stability against stray magnetic field, and improved write efficiency. The present invention addresses such a need.

SUMMARY OF THE INVENTION

The present invention provides method and system for providing a magnetic memory. The method and system comprise providing a plurality of magnetic elements and a plurality of reference layers. Each of the plurality of magnetic elements includes a free layer and a spacer layer. Each of the plurality of reference layers is coupled with a corresponding portion of the plurality of magnetic elements. The plurality of reference layers is ferromagnetic. A portion of each of the plurality of reference layers functions as at least a portion of a pinned layer for each of the corresponding portion of the plurality of magnetic elements. The portion of each of the plurality of reference layers also functions as a write line for the corresponding portion of the plurality of magnetic elements. The spacer layer resides between the free layer of each of the plurality of magnetic elements and the reference layer.

According to the system and method disclosed herein, the present invention provides a magnetic memory that is not compromised during processing. In addition, the present invention may provide a magnetic material that utilizes a simplified manufacturing process, provides a reduced cell size, has improved reliability, improved stability against stray magnetic field, and improved write efficiency.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Co-pending U.S. patent application Ser. No. 10/459,133 entitled "MRAM MEMORIES UTILIZING MAGNETIC WRITE LINES" assigned to the assignee of the present application describes a MRAM architecture that addresses many of the issues encountered in conventional MRAM deices. Applicant hereby incorporates by reference the above-identified co-pending application.

Figure 2:
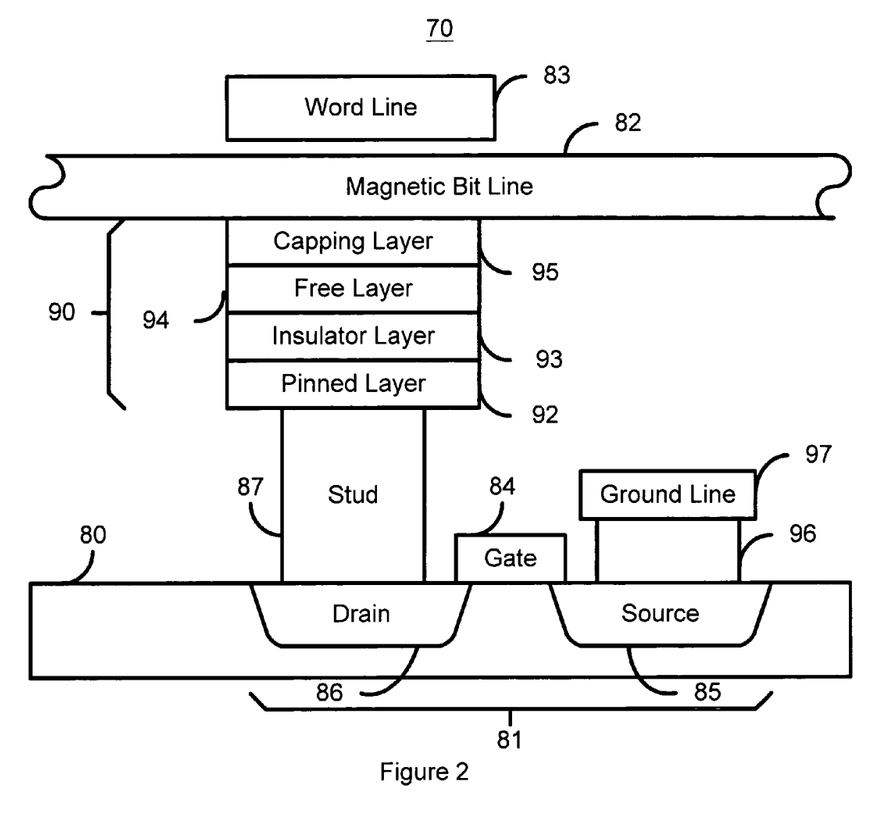
FIG. 2 depicts a cross-section of one embodiment of an MRAM including magnetic write line(s).

FIG. 2 depicts a cross-section of one embodiment of a portion of an MRAM 70 including the basic structure described in the above-identified co-pending application. The MRAM 70 depicted in FIG. 2 includes a magnetic element 90, which is preferably a MTJ stack 90, a selection device 81 formed in a substrate 80, a magnetic write line 82, a bit line 83, a conductive stud 87, connecting stud 96 and ground line 97. The selection device 81 is preferably a FET transistor including gate 84, source 85 and drain 86. The MTJ stack also includes the pinned layer 92 having a fixed magnetic vector (not shown), a tunneling layer 93, a free layer 94 having a changeable magnetic vector (not shown), and a conductive capping layer 95. The conductive capping layer 95 is preferably a nonmagnetic spacer layer 95. The MTJ stack includes layers (not explicitly shown) that includes seed and, preferably, antiferromagnetic layers.

The magnetic write line 82 includes soft magnetic materials and is separated from the free layer 94 of the MTJ stack 90 by the non-magnetic spacer layer 95. In one embodiment, the write line 83 is also magnetic. The magnetic write line 82 is preferably substantially or completely composed of a soft magnetic material. In addition, at least a core, as opposed to only a cladding layer, includes the soft magnetic layer. In an alternate embodiment, the magnetic write line 82 may be a laminate including one or more layers of magnetic material alternating with one or more layers of nonmagnetic material. Further, the magnetic write line 82 may be magnetic or nonmagnetic and be separated from a soft magnetic layer (not shown) by an insulating layer (not shown). Due to the small spacing between the magnetic write line 82 and the free layer 94, the magnetic vector of free layer 94 is strongly coupled magnetostatically to the magnetic vector of the magnetic write line 82. Such a magnetostatic coupling promotes rotation amplitude for the free layer magnetic vector. Hence, write efficiency is improved. In addition, the write line 83 may also be magnetic in the manner described above with respect to the magnetic write line 82.

Although the MRAM architecture described in the above-identified co-pending application functions well for its intended purpose, one of ordinary skill in the art will readily recognize it is still desirable to obtain a magnetic memory, such as an MRAM that may have a simplified manufacturing process, reduced cell size, improved reliability, improved stability against stray magnetic field, and improved write efficiency.

The present invention provides method and system for providing a magnetic memory. The method and system comprise providing a plurality of magnetic elements and a plurality of reference layers. Each of the plurality of magnetic elements includes a free layer and a spacer layer. Each of the plurality of reference layers is coupled with a corresponding portion of the plurality of magnetic elements. The plurality of reference layers is ferromagnetic. A portion of each of the plurality of reference layers functions as at least a portion of a pinned layer for each of the corresponding portion of the plurality of magnetic elements. The portion of each of the plurality of reference layers also functions as a write line for the corresponding portion of the plurality of magnetic elements. The spacer layer resides between the free layer of each of the plurality of magnetic elements and the reference layer.

The present invention will be described in terms of particular types of magnetic memory cells, particular materials, and a particular configuration of elements. For example, the present invention will be described in the context of illustrative magnetic random access memory (MRAM) cells. One of ordinary skill in the art will, however, recognize that the present invention is not limited to any particular magnetic memory devices. Thus, one of ordinary skill in the art will readily realize that this method and system will operate effectively for other magnetic memory cells, and other materials and configurations non inconsistent with the present invention. Instead, the present invention is applicable to other magnetic memory devices, particularly those in which a reduction in process complexity, a decrease cell size and an improvement write efficiency is desired. For example, although MTJ stacks are described as including single magnetic layers, nothing prevents the use of other materials, other alloys and synthetic layers. In addition, although the present invention is described in the context of metal-oxide-semiconductor (MOS) devices and magnetic tunneling junction (MTJ) devices, one of ordinary skill in the art will readily recognize that the present invention is not limited to such devices. Instead, other suitable devices, for example bipolar junction transistor devices and spin-valve giant magnetoresistive memory elements, may be similarly used, with or without modification to the memory architecture. One of ordinary skill in the art will also readily recognize that although the present invention is described using the terms "word line" and "bit line" are used to refer to particular lines of particular location and orientation for clarity. However, one of ordinary skill in the art will readily recognize that these terms are for reference purposes only, and can be exchanged or substituted with other names for the write lines. The present invention is also described in the context of a certain number of reference layers and MTJ stacks. However, one of ordinary skill in the art will readily recognize that the method and system are generally used with a large number of reference layers and MTJ stacks.

Figure 3:
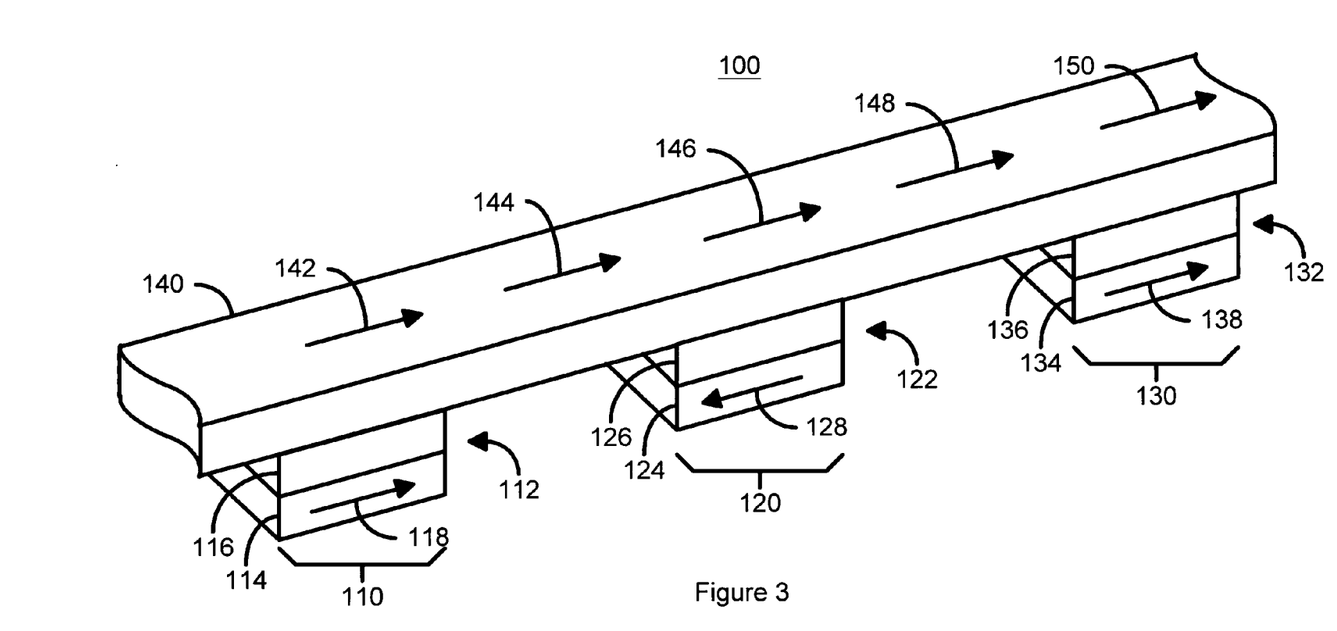
FIG. 3 depicts a three-dimensional view of the first embodiment of a magnetic memory in accordance with the present invention.

To more particularly illustrate the method and system in accordance with the present invention, refer now to FIG. 3, depicting a three-dimensional view of the first embodiment of a magnetic memory 100 in accordance with the present invention. The magnetic memory 100 is preferably an MRAM 100. The MRAM 100 is shown as including three magnetic memory cells 110, 120, and 130 as well as a reference layer 140. The reference layer 140 also acts as a magnetic write line 140. Thus, the magnetic write lines described in the above-identified co-pending application may be used as the reference layer 140. In addition, other magnetic write lines not inconsistent with the present invention as described herein can also be used as the reference layer 140.

The reference layer 140 includes magnetic vectors 142, 144, 146, 148, and 150 that preferably rotate no more than approximately ninety degrees from their equilibrium position during writing and return to their equilibrium position when writing is completed. The equilibrium position of the magnetic vectors 142, 144, 146, 148, and 150 is preferably in the lengthwise direction of the reference layer 140, as depicted in FIG. 3. In addition, the reference layer 140 is shared by all three magnetic memory cells 110, 120, and 130.

Each magnetic memory cell 110, 120, and 130 effectively includes an MTJ stack 112, 122, and 132, respectively. For clarity, only the MTJ stacks 112, 122, and 132 are depicted for the memory cells 110, 120, and 130. Thus, other elements, such as selection and/or isolation devices, and other write lines are omitted. The MTJ stacks 112, 122, and 132 include a layer 114, 124, and 134, respectively, and a tunneling layer 116, 126, and 136, respectively. As discussed below, portions of the reference layer 140 can also be considered to be part of the MTJ stacks 112, 122, and 132.

Each of the layers 114, 124, and 134 of the memory cells 110, 120, and 130, respectively, is a soft ferromagnetic layer and has an associated magnetic vector 118, 128, and 138, respectively. The layers 114, 124, and 124 act as and are referred to herein as free layers. The free layers 114, 124, and 134 are termed free layers because their magnetic vectors 118, 128, and 138, respectively, can take one of the two preferred directions. The easy axis of each of the free layers 114, 124, and 134 of the magnetic memory cells 110, 120, and 130 is preferably in the lengthwise direction of the reference layer 140. The free layers 114, 124, and 134 are made of soft magnetic material, such as nickel, cobalt, iron, or alloy thereof. Other elements, such as boron and nitrogen, can also be added to produce desirable magnetic properties. The magnetic vectors 118, 128, and 138 are changeable and thus may be in different directions. The tunneling layers 114, 124, and 134 are insulating layers through which charge carriers can tunnel under the appropriate conditions. The tunneling layers 116, 126, and 126 are preferably made of aluminum oxide, other oxide, or composite of two or more insulating layers. Note that the free layers 114, 124, and 134 are preferably formed from a material deposited as a single layer, then patterned to form separate free layers 114, 124, and 134, respectively, for the separate magnetic memory cells 110, 120, and 130, respectively. Similarly, the tunneling layers 116, 126, and 136 are preferably formed from a material deposited as a single layer, then patterned to form separate tunneling layers 116, 126, and 136, respectively, for the separate magnetic memory cells 110, 120, and 130, respectively.

The reference layer 140 is preferably made of similar materials as those used for the free layers 114, 124, and 134. The reference layer 140 is also patterned into the shape of and used as a conductor line. In addition to being the reference layer 140 for the corresponding magnetic memory cells 110, 120, and 130, the reference layer 140 is thus designed to carry a write current to function as a write word line. The reference layer 140 is depicted as a single layer structure in FIG. 3. However, one of ordinary skill in the art will readily recognize that layers of different material, either magnetic or nonmagnetic, can be incorporated into the reference layer 140 to adjust its magnetic and electrical properties.

At equilibrium, there no current is present in the reference layer 140 and no magnetic field is applied to the magnetic memory cells 110, 120, and 130. At equilibrium, the magnetic vectors 142, 144, 146, 148, and 150 in the reference layer 140 preferably lie along the direction of its symmetrical axis. Stated differently, under such conditions, the magnetic vectors 142, 144, 146, 148, and 150 preferably lie along the lengthwise direction of the reference layer 140. At such an equilibrium, the magnetic vectors 118, 128, and 138 in the free layers 114, 124, and 134, respectively are either parallel or anti-parallel to the magnetic vectors 142, 146, and 150, respectively. As a result, at equilibrium each of the memory cells 110, 120, and 130, has either a 'low' resistance state or a 'high' resistance state, as measured across the tunneling layer 116, 126, or 136, respectively. The low resistance state corresponds to the magnetic vectors 142, 146, and 150 being parallel to the magnetic vectors 118, 128 and 138. The high resistance state corresponds to the magnetic vectors 142, 146, and 150 being antiparallel to the magnetic vectors 118, 128 and 138. In one encoding scheme, the "low" resistance state may be used to represent a zero, and "high" resistance state to represent a one.

The write process in such a kind of MRAM structure is discussed in detail in the above-identified co-pending patent application. For clarity, such a write process is described for the memory cell 110. When a write current is present in the reference layer 140, a magnetic field is induced. This magnetic field rotates the magnetic vector 118 away from its equilibrium position (away from the lengthwise direction of the reference layer 140). There is a strong magnetostatic coupling between the magnetic vector 118 and the magnetic vector 142. Consequently, the magnetic vector also rotates in a direction opposite to that in which the magnetic vector 118 rotates. For example, if the magnetic vector 118 rotates in a clockwise direction, the magnetic vector 142 rotates in a counter clockwise direction. Thus, the magnetic vectors 118 and 142 form a flux closure for the magnetic vector 118. Such a flux closure promotes a rotation amplitude for the magnetic vector 118 of the free layer 114. Hence, a relatively small current in the line 140 can produce a fairly large rotation angle in the magnetic vector 118 of the free layer 114. A second magnetic field, which can be produced by another metal line (not shown) carrying a current, could rotate the magnetic vector 114 more than ninety degrees from its original position if the second magnetic field is along the symmetrical axis of the reference layer 140 and opposite to the original position of the magnetic vector 114. The magnetic vector 114 settles in a new direction after the two write currents are removed, thus completing the writing process. When the writing process is completed, the magnetic vector 142 of the reference layer 140 returns to its original direction. The crystal anisotropy and shape anisotropy of the reference layer 140 are preferably designed so that the magnetic vectors 142, 146, and 150 rotate at most in a half circle and return to their original direction after the writing process.

Figure 4:
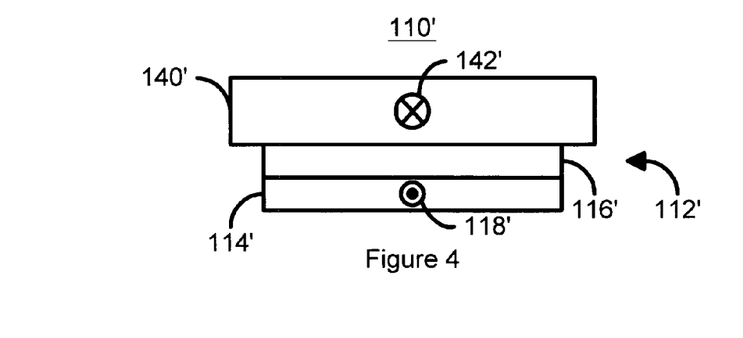
FIG. 4 is a cross-sectional view taken through a MTJ stack and perpendicular to the symmetric axis of the magnetic write line of the first embodiment of the magnetic memory in accordance with the present invention.

FIG. 4 is a cross-sectional view taken through a MTJ stack 110' and perpendicular to the symmetric axis of the reference layer 140' of the first embodiment of the magnetic memory 100' in accordance with the present invention. The magnetic memory 100' is analogous to the magnetic memory 100 depicted in FIG. 3. Consequently, portions of the magnetic memory 100' are labeled analogously. Referring to FIGS. 3 and 4, the width of line 140 or 140' can be the same as the width of free layers 114 or 114', 124, and 134, or it can be wider than the free layers 114 or 114', 124, and 134. In the magnetic memory 100' depicted in FIG. 4, the reference layer 140' is wider than the MTJ 112'.

Thus, the MRAM 100 includes magnetic memory cells 110, 120, and 130 having MTJ stacks 112, 122, and 132, respectively that are simpler to fabricate, that have improved structural reliability, and that are better able withstand high temperature processes. The MRAM 100 need not use AFM layers in order to pin the magnetic vectors 142, 144, 146, 148, and 150 of the reference layer 140. Instead, crystal and shape anisotropy of the reference layer 140 are designed to maintain the magnetic vector in the reference layer in substantially the same orientation, except in the writing process. Consequently, the adverse effect of high temperature anneals used in conventional CMOS processes on the exchange coupling between the AFM layer and the conventional pinned layer is avoided. The MRAM 100 is thus less likely to be damaged during fabrication. Use of the reference layer 140 as a magnetic write word line can also provide improved write efficiency. Because of the magnetostatic coupling between the reference layer 140 and the free layers 114, 124, and 134, the magnetic moments 142, 146, and 150 of the reference layer 140 in the region overlapping the free layers 114, 124, and 134, respectively also change direction. As a result, a flux closure with the magnetic vectors 118, 128, and 138 of the free layers 114, 124, and 134, respectively. Such a flux closure significantly improves the write efficiency. The MRAM 100' shares the same benefits as the MRAM 100.

Figure 5A:
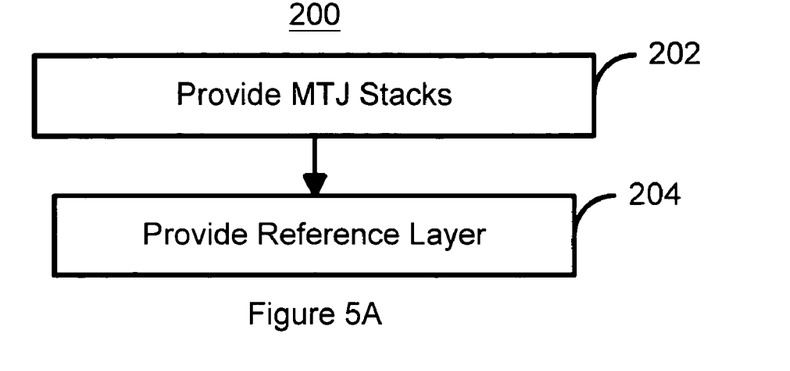
FIG. 5A depicts a high-level flow chart of one embodiment of a method for providing the first embodiment of a magnetic memory in accordance with the present invention.

FIG. 5A depicts a high-level flow chart of one embodiment of a method 200 for providing the first embodiment of a magnetic memory in accordance with the present invention. For clarity, the method 200 is described in conjunction with the MRAM 100 depicted in FIG. 3. However, one of ordinary skill in the art will readily recognize that the method 200 can be used in fabricating other MRAMs, such as the MRAM 100'. Referring to FIGS. 3 and 5A, the MTJ stacks 112, 122, and 132 are formed, via step 202. Step 202 includes forming the free layers 114, 124, and 134 and the tunneling layers 116, 126, and 136, respectively. The reference layer 140 is formed, via step 204.

Figure 5B:
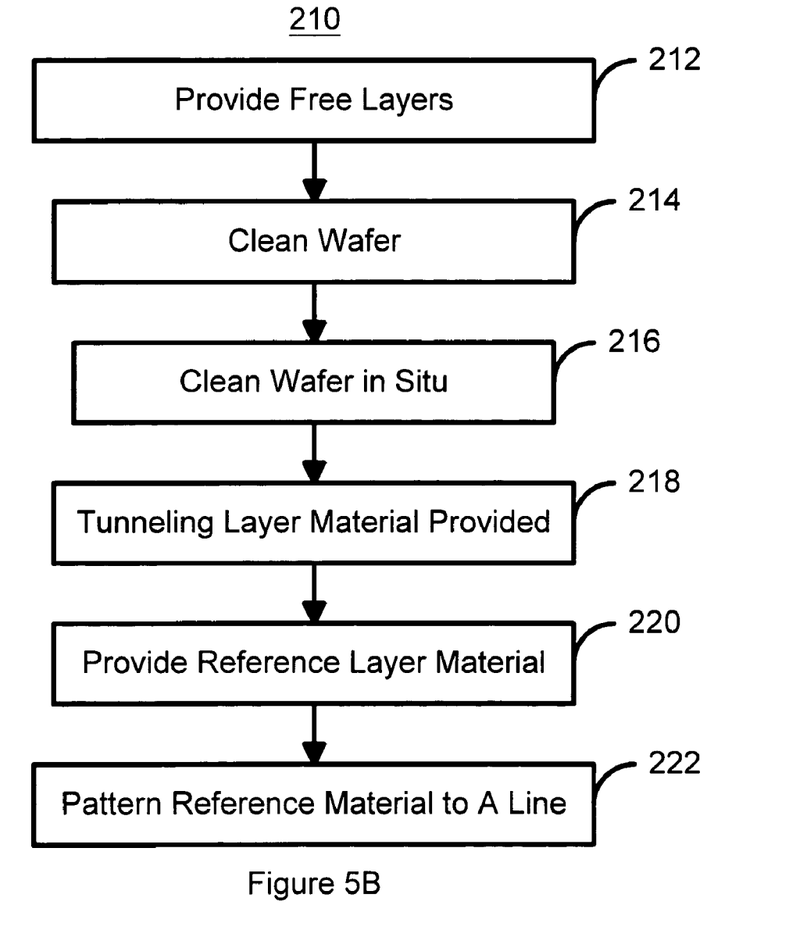
FIG. 5B depicts a more detailed flow chart of one embodiment of a method for providing the first embodiment of a magnetic memory in accordance with the present invention.

FIG. 5B depicts a more detailed flow chart of one embodiment of a method 210 for providing the first embodiment of a magnetic memory in accordance with the present invention. For clarity, the method 210 is described in conjunction with the MRAM 100 depicted in FIG. 3. However, one of ordinary skill in the art will readily recognize that the method 210 can be used in fabricating other MRAMs, such as the MRAM 100'. Referring to FIGS. 3 and 5B, the free layers 114, 124, and 134 are formed by depositing the ferromagnetic material(s) and defining the free layers 114, 124, and 134, via step 212. A wafer containing the MRAM 100 is cleaned, via step 214. The wafer containing the MRAM 100 is put back into the MTJ deposition machine to process the tunneling layers 116, 126, and 136. Before the tunneling layer deposition, an in-situ cleaning and surface smoothing process is preferably performed, via step 216. The in-situ cleaning is preferably performed either by a low angle ion beam etching or by ion milling. This cleaning in step 216 is preferred to remove the thin oxide layer on the surface of the free layer 114, 124, and 134. The material for the tunneling layers 116, 126, and 136 is deposited and oxidized in the MTJ deposition machine, via step 218. In a preferred embodiment, the tunneling layer processed according to this invention commences as a sheet film covering substantially the whole wafer. Thus, shorting between the free layer and the reference layer across the edges of the tunneling layer may be avoided. Referring back to FIG. 5B, a layer of ferromagnetic material designed for the reference layer 140 is deposited, via step 220. A photolithography and patterning process are performed to form the reference layer 140 into a line, via step 222. Fabrication of the MRAM 100 can then be completed.

Thus, the methods 200 and 210 can be used to fabricate the MRAM 100 or 100'. Because an anneal is not needed to align AFM layers, the methods 200 and 210 simpler than conventional methods. In addition, because the MRAMs 100 and 100' do not utilize an AFM layer, processing used in completing fabrication of the MRAM 100 or 100', such as an anneal in a forming gas, do not damage such a layer. Thus, in addition to being simpler, the methods 200 and 210 can fabricate magnetic memories having the advantages discussed above with respect to the MRAMs 100 and 100'.

Figure 6A:
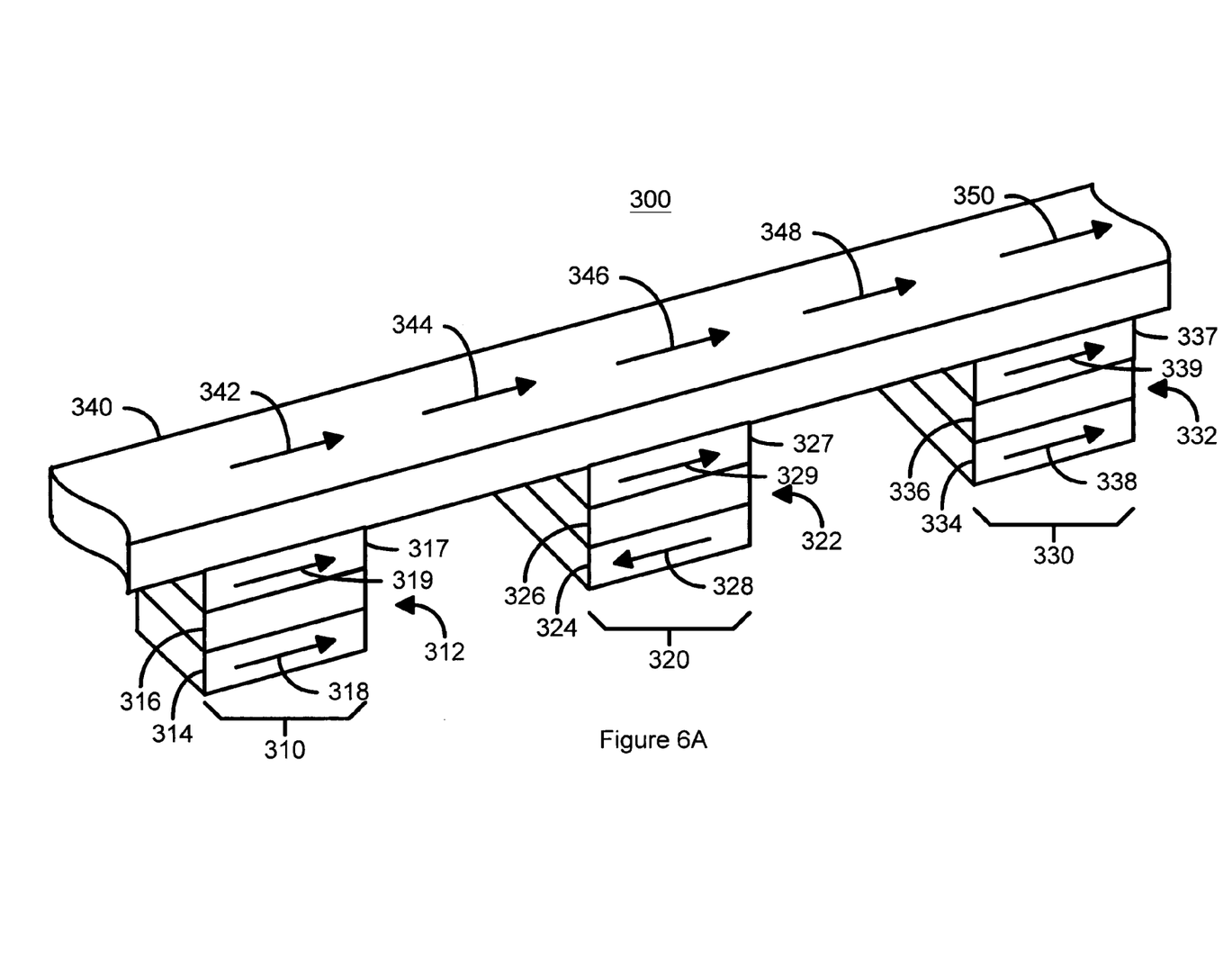
FIG. 6A depicts a three-dimensional view of the second embodiment of a magnetic memory in accordance the present invention.

FIG. 6A depicts a three-dimensional view of the second embodiment of a magnetic memory 300, which is preferably an MRAM 300, in accordance the present invention. The MRAM 300 is similar to the MRAM 100 depicted in FIG. 3. Consequently, analogous components of the MRAM 300 are labeled in a manner that is analogous to the MRAM 100. For example, the magnetic memory cells 310, 320 and 330 of the MRAM 300 correspond to the magnetic memory cells 110, 120, and 130 of the MRAM 100. The MTJ stacks 312, 322 and 332 of the MRAM 300 correspond to the MTJ stacks 112, 122, and 132 of the MRAM 100. The free layers 314, 324 and 334 of the MRAM 300 correspond to the free layers 114, 124, and 134 of the MRAM 100. The tunneling layers 316, 326 and 336 of the MRAM 300 correspond to the tunneling layers 116, 126, and 136 of the MRAM 100. The magnetic vectors 318, 328 and 338 of the MRAM 300 correspond to the magnetic vectors 118, 128, and 138 of the MRAM 100. The reference layer 340 corresponds to the reference layer 140.

The MTJ stacks 312, 324, and 334 and the reference layer 340 function in an analogous manner to the MTJ stacks 112, 124, and 134 and the reference layer 140, respectively. In addition, a layer of soft ferromagnetic material, layers 317, 327, and 337, are added, thereby forming the MTJ stacks 312, 324, and 334. Note that the layers 317, 327, and 337 are preferably formed from a material deposited as a single layer, then patterned to form separate layers 317, 327, and 337, respectively, for the separate magnetic memory cells 310, 320, and 330, respectively. The layers 317, 327, and 337 are designed and processed to have a strong ferromagnetic exchange coupling with the reference layer 340. Consequently, the magnetic vectors 319, 329, and 339 of the layers 317, 327, and 337, respectively, orients in the same direction as the magnetic vectors 342, 346, and 350, respectively, in the reference layer 340.

Figure 6B:
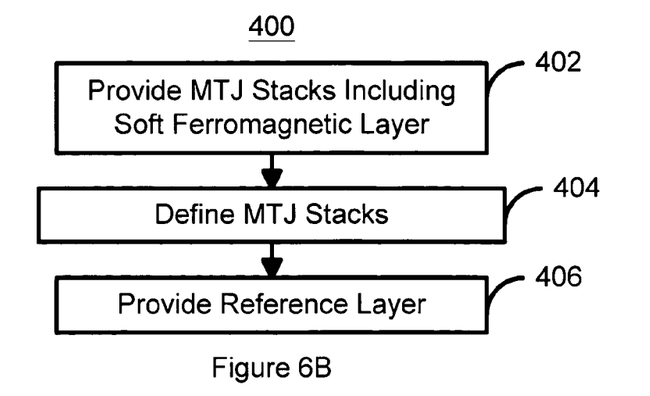
FIG. 6B depicts a high-level flow chart of one embodiment of a method for providing the first embodiment of a magnetic memory in accordance with the present invention.

FIG. 6B depicts a high-level flow chart of one embodiment of a method 400 for providing the first embodiment of a magnetic memory in accordance with the present invention. For clarity, the method 400 is described in conjunction with the MRAM 300 depicted in FIG. 6A. However, one of ordinary skill in the art will readily recognize that the method 400 can be used in fabricating other MRAMs. Referring to FIGS. 6A and 6B, the MTJ stacks 312, 322, and 332 including the reference layers 317, 327, and 337, respectively, are formed, via step 402. Step 402 includes forming the free layers 314, 324, and 334, the tunneling layers 316, 326, and 336, and the soft ferromagnetic layers 317, 327, and 337, respectively. The MTJ stack is patterned via step 404. The reference layer 140 is formed, via step 406. Thus, the method 400 is substantially the same as the method 200 depicted in FIG. 5A, with the additional step of forming the soft ferromagnetic layers 317, 327, and 337.

Figure 6C:
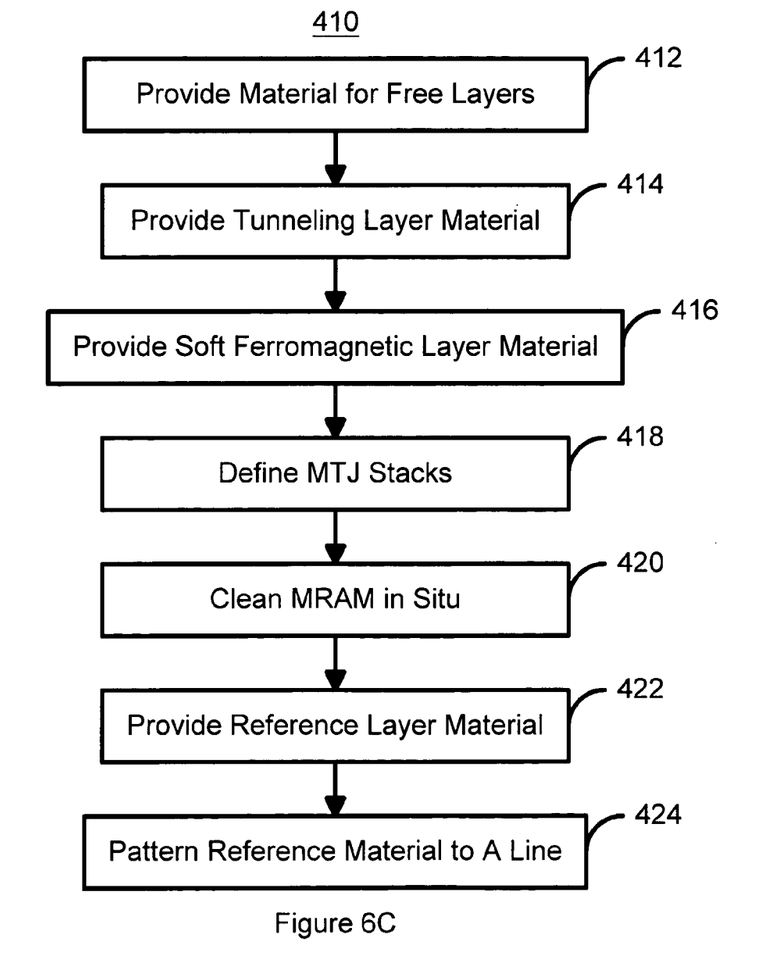
FIG. 6C depicts a more detailed flow chart of one embodiment of a method for providing the first embodiment of a magnetic memory in accordance with the present invention.

FIG. 6C depicts a more detailed flow chart of one embodiment of a method 410 for providing the second embodiment of a magnetic memory in accordance with the present invention. For clarity, the method 410 is described in conjunction with the MRAM 300 depicted in FIG. 6A. However, one of ordinary skill in the art will readily recognize that the method 410 can be used in fabricating other MRAMs. Referring to FIGS. 6A and 6B, the material for forming the free layers 314, 324, and 334 is deposited, via step 412. The material for the tunneling layers 316, 326, and 336 is deposited and oxidized, via step 414. The material(s) for the layers 317, 327, and 337 is provided, via step 416. The MTJ stacks 312, 322, and 332 are defined, via step 418. Thus, steps 412–414 and 418 are used to perform steps 402 and 404 of the method 400 depicted in FIG. 6B. Referring back to FIGS. 6A and 6C, the surface(s) of the MRAM that are then cleaned in a vacuum or other suitable chamber, via step 420. The possible cleaning processes include, but not limited to, ion beam etching or ion milling. The cleaning is performed to help ensure that an adequate exchange coupling, which is an inter-atom phenomenon, can be obtained. A layer of ferromagnetic material designed for the reference layer 340 is deposited, via step 422. A photolithography and patterning process are performed to form the reference layer 340 into a line, via step 424. Fabrication of the MRAM 300 can then be completed.

The MRAM 300 shares the benefits of the MRAMs 100 and 100'. In addition, use of the layers 317, 327, and 337 protects the underlying tunneling layers 316, 326, and 336 from damage that may occur during the patterning process carried out in step 408 (defining the MTJ stacks 312, 324, and 334). In addition, the two interfaces between the tunneling layers 316, 326, and 336 and the ferromagnetic layers 314, 326, and 336, and the reference layer 140 are not exposed to the ambient during processing. Damage or contamination to the tunneling layers 316, 326, and 336 that may deteriorate the tunneling mechanism, or in the worst case, cause shorting between the free layer 314, 324, and 334 and the reference layer 340 is thus reduced. Thus, the MRAM 300 may allow for improved fabrication of the MRAM 300. Consequently, the quantum mechanical tunneling phenomenon should not be compromised during wafer fabrication. Thus, the MRAM 300 should also have improved performance of the tunneling layers 316, 326, and 336.

Figure 7:
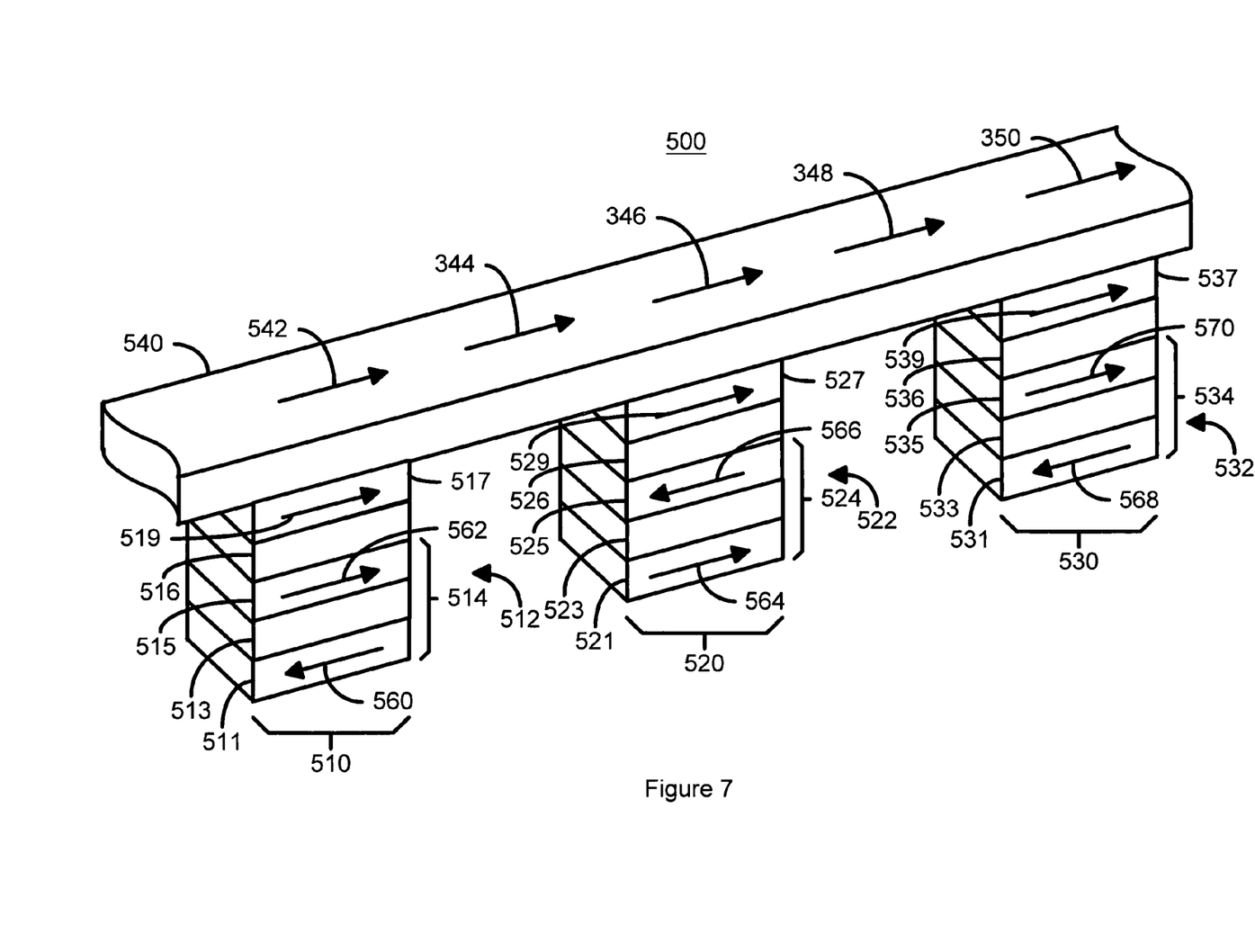
FIG. 7 is a three-dimensional view of the third embodiment of a magnetic memory in accordance the present invention.

FIG. 7 is a three-dimensional view of the third embodiment of a magnetic memory 500 that is preferably an MRAM, in accordance the present invention. The MRAM 500 is similar to the MRAM 300 depicted in FIG. 6A. Consequently, analogous components of the MRAM 500 are labeled in a manner that is analogous to the MRAM 300. For example, the magnetic memory cells 510, 520 and 530 of the MRAM 500 correspond to the magnetic memory cells 310, 320, and 330 of the MRAM 300. The MTJ stacks 512, 522 and 532 of the MRAM 500 correspond to the MTJ stacks 312, 322, and 332 of the MRAM 300. The free layers 514, 524 and 534 of the MRAM 500 correspond to the free layers 314, 324, and 334 of the MRAM 300. The tunneling layers 516, 526 and 536 of the MRAM 500 correspond to the tunneling layers 316, 326, and 336 of the MRAM 300. The magnetic vectors 518, 528 and 538 of the MRAM 500 correspond to the magnetic vectors 318, 328, and 338 of the MRAM 300. The layers 517, 527 and 537 of the MRAM 500 correspond to the layers 317, 327, and 337 of the MRAM 300. The reference layer 540 corresponds to the reference layer 340. However, the free layers 514, 524, and 537 are synthetic free layers. Thus, the free layer 514 includes soft ferromagnetic layers 511 and 515 separated by a nonmagnetic spacer layer 513. Similarly, the free layer 524 includes soft ferromagnetic layers 521 and 525 separated by a nonmagnetic spacer layer 523. The free layer 534 includes soft ferromagnetic layers 531 and 535 separated by a nonmagnetic spacer layer 533.

The free layers 514, 524, and 534 of the MRAM 500 have been modified to include the first soft magnetic layers 511, 521, and 531, respectively, the second soft magnetic layers 515, 525, and 535, and the spacer layer 513, 523, and 533. The thickness(es) of spacer layers 513, 523, and 533 are much smaller than its lateral dimension so that a magnetostatic coupling between the soft magnetic layers 511 and 515, 521 and 525, and 531 and 535, respectively, can occur. On the other hand, the spacer layers 513, 523, and 533 should be thick enough to prevent exchange coupling between the soft magnetic layers 511 and 515, 521 and 525, and 531 and 535, respectively. The spacer layers 513, 523, and 533 can be made from a wide variety of metals, semi-metals and semiconducting materials. The spacer layers 513, 523, and 533 can also be formed from insulating materials if the resistances of the spacer layers 513, 523, and 533 are small compared to that of the tunnel barrier layers 516, 526, and 536, respectively. Due to the magnetostatic coupling, the magnetic moments of layers the soft magnetic layer 511 and 515, 521 and 525, and 531 and 535 are antiparallel. Consequently, the multilayer free layers 512, 524, and 534 have reduced net magnetic moments. The reduced net magnetic moments of the free layers 512, 524, and 534 reduces the magnetostatic interference between MTJ stacks 512, 522, and 532 in adjacent magnetic memory cells 510, 520, and 530. As a result, magnetic memory cells 510, 520, and 530 can be packed at a higher density. In addition, the reduced net magnetic moments of the free layers 514, 524, and 534 reduces magnetostatic interaction between the free layers 514, 524, and 534, respectively and the reference layer 540. Therefore, the directions of the magnetic vectors 542, 546, and 550 in the reference layer 540 may not be significantly affected by the free layers 514, 524, and 534. Consequently, the preferred direction of the magnetic vectors 542, 544, 546, 548, and 560, which is along the long axis of the reference layer 540, can be maintained. Furthermore, the reduced net magnetic moment of the free layers 514, 524, and 534 reduces demagnetizing field, thereby hence improving the magnetic stability of the free layers 514, 524, 534.

The resistances of the MTJ stacks 512, 522 and 532 of the MRAM 500 depend on the directions of the magnetic vectors of the layers 515, 525, and 535, respectively, with respect to the direction of the magnetic vectors 542, 546, and 550, respectively. If the magnetic vector 562, 566, or 570 is parallel to the magnetic vectors 542, 546, and 550, respectively, the MTJ stack 512, 522, and 532, respectively, is in a low resistance state. If the magnetic vector 562, 566, or 570 is antiparallel to the magnetic vectors 542, 546, and 550, respectively, the MTJ stack 512, 522, and 532, respectively, is in a high resistance state. In a preferred encoding scheme, the low resistance state could represent a logical zero, while the high resistance state could represent a logical one.

Figure 8:
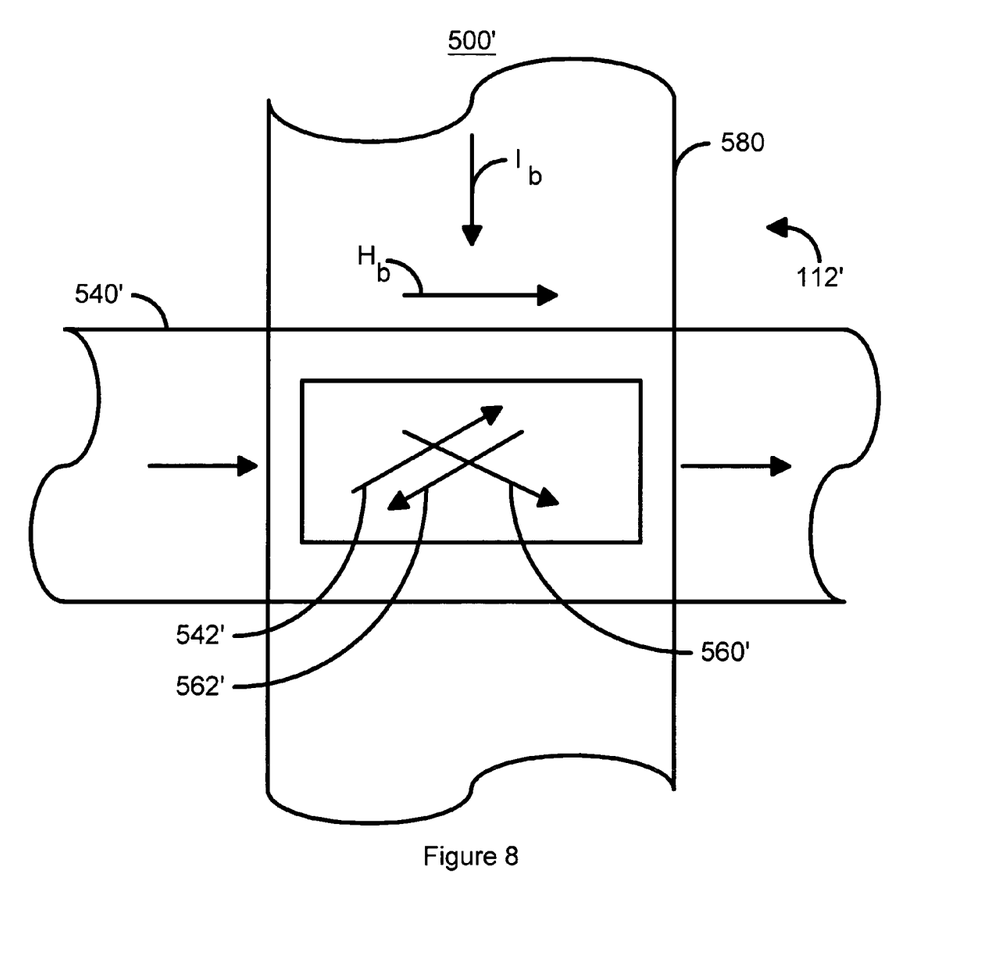
FIG. 8 is a diagram illustrating one embodiment of the writing (switching) process of a MTJ stack in the third embodiment of a magnetic memory in accordance with the present invention.

FIG. 8 is a diagram illustrating one embodiment of the writing (switching) process of an MTJ stack 510' in the third embodiment of a magnetic memory 500 in accordance with the present invention. The magnetic memory 500' is analogous to the magnetic memory 500 depicted in FIG. 7. Consequently, portions of the magnetic memory 500' are labeled analogously. Referring to FIGS. 7 and 8, a second write line 580 is also depicted. The second write line 580 is preferably oriented to be orthogonal to the reference layer 540' and is preferably underneath the MTJ stack 510'.

When a write current is present in the reference layer 540', a magnetic field induced by the write line current rotates the magnetic vectors 560' and 562' of soft ferromagnetic layers 511' and 515' (not explicitly shown in FIG. 8) away from the easy axis. There is also a strong magnetostatic coupling between the magnetic vectors 560' and 562' in both the layers 511' and 515' (not explicitly shown in FIG. 8) and the magnetic vectors 542'–550' of the reference layer 540'. Consequently, the magnetic vector 542' of the reference layer 540' also rotates in the opposite direction, thereby forming a flux closure with the magnetic vectors 560' and 562' of the layers 511' and 515', respectively. Analogous flux closures also promote increased rotation amplitude for the magnetic vectors 564' and 566' and 568' and 570'. The write efficiency of the reference layer 540' is thus improved. A write current $I_b$ is also provided in the second write line 580. The write current in the second write line 580 generates a field $H_b$. The magnetic vector 562' in the layer 515' further rotates in the direction of the magnetic vector 560' in the layer 511'. Assuming that the layer 515' has a much smaller coercivity and much bigger magnetic moment than the layer 511', the magnetic vector 562' in the layer 515' settles in a new direction once the current in the reference layer 540' is removed. If the layer 511' has a coercivity smaller than the magnetostatic field from the edge of the layer 515' minus the field associated with $I_b$ in the second write line 580, the magnetic vector 560' in the layer 511' switches and settle in the direction opposite to the magnetic vector 562'. The free layer 514' is thus still stable and the writing process is completed.

The MRAM 500 shares the same benefits as the MRAM 300. In addition, the net magnetic moments of the free layers 514, 524, and 534 are reduced. Consequently, the magnetostatic interactions between the free layers 514, 524, and 534 and other layers are reduced. Thus, the preferred direction of the reference layer 540 can be better maintained. Furthermore, magnetostatic coupling between magnetic memory cells 510, 520, and 530 is reduced. In addition, the demagnetizing field of the free layers 514, 524, and 534 is reduced. The magnetic stability of the free layers 514, 524, and 534 is improved. The MRAM 500' shares the benefits of the MRAM 500.

A method and system has been disclosed for an improved magnetic memory. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory comprising:
   a plurality of magnetic elements, each of the plurality of magnetic elements including a free layer and a spacer layer; and
   a plurality of reference layers, each of the plurality of reference layers coupled with a corresponding portion of the plurality of magnetic elements, the plurality of reference layers being ferromagnetic, a portion of each of the plurality of reference layers functioning as at least a portion of a pinned layer for each of the corresponding portion of the plurality of magnetic elements and as a write line for the corresponding portion of the plurality of magnetic elements, the spacer layer residing between the free layer of each of the plurality of magnetic elements and the reference layer, each of the plurality of reference layers having a core portion including a ferromagnetic material.

2. The magnetic memory of claim 1 wherein each of the plurality of magnetic elements is a magnetic tunneling junction and wherein the spacer layer is a tunneling layer.

3. The magnetic memory of claim 1 wherein the plurality of reference layers has a first width and the plurality of magnetic elements has a second width.

4. The magnetic memory of claim 3 wherein the first width is less than the second width.

5. The magnetic memory of claim 3 wherein the first width is the same as the second width.

6. The magnetic memory of claim 1 wherein each of the plurality of magnetic element further includes a soft ferromagnetic layer, the soft ferromagnetic layer residing between the spacer layer and the reference layer.

7. The magnetic memory of claim 6 wherein the free layer further includes a first ferromagnetic layer having a first magnetic vector, a second ferromagnetic layer having a second magnetic vector, and a nonmagnetic spacer layer between the first ferromagnetic layer and the second ferromagnetic layer, the nonmagnetic spacer layer being configured such that the first ferromagnetic layer and the second ferromagnetic layer are magnetostatically coupled so that the first magnetic vector and the second magnetic vector are antiparallel.

8. The magnetic memory of claim 1 further comprising:
   a plurality of isolation devices for the plurality of magnetic elements.

9. A method for providing magnetic memory comprising:
   (a) providing a plurality of magnetic elements, each of the plurality of magnetic elements including a free layer and a spacer layer; and
   (b) providing a plurality of reference layers, each of the plurality of reference layers coupled with a corresponding portion of the plurality of magnetic elements, the plurality of reference layers being ferromagnetic, a portion of each of the plurality of reference layers functioning as at least a portion of a pinned layer for each of the corresponding portion of the plurality of magnetic elements and as a write line for the corresponding portion of the plurality of magnetic elements, the spacer layer residing between the free layer of each of the plurality of magnetic elements and the reference layer, each of the plurality of reference layers having a core portion including a ferromagnetic material.

10. The method of claim 9 wherein each of the plurality of magnetic elements is a magnetic tunneling junction and wherein the spacer layer is a tunneling layer.

11. The method of claim 9 wherein the plurality of reference layers has a first width and the plurality of magnetic elements has a second width.

12. The method of claim 11 wherein the first width is less than the second width.

13. The method of claim 11 wherein the first width is the same as the second width.

14. The method of claim 9 wherein the plurality of magnetic elements providing step further includes the steps of:
   (a1) for each of the plurality of magnetic elements, providing a soft ferromagnetic layer, the soft ferromagnetic layer residing between the spacer layer and the reference layer.

15. The method of claim 14 wherein the plurality of magnetic element providing step (a) further includes the step of:
   (a2) for the free layer, providing a first ferromagnetic layer having a first magnetic vector, a second ferromagnetic layer having a second magnetic vector, and a nonmagnetic spacer layer between the first ferromagnetic layer and the second ferromagnetic layer, the nonmagnetic spacer layer being configured such that the first ferromagnetic layer and the second ferromagnetic layer are magnetostatically coupled so that the first magnetic vector and the second magnetic vector are antiparallel.

16. The method of claim 14 wherein the plurality of magnetic element providing step (a) further includes the steps of:
   (a2) defining the plurality of magnetic elements after the soft magnetic layer has been provided.

17. The method of claim 9 further comprising the step of:
   (c) providing a plurality of isolation devices for the plurality of magnetic elements.

* * * * *